United States Patent [19]
Kataoka et al.

[11] Patent Number: 5,389,159
[45] Date of Patent: Feb. 14, 1995

[54] SOLAR CELL MODULE AND METHOD FOR PRODUCING THE SAME

[75] Inventors: Ichiro Kataoka, Tsuzuki; Soichiro Kawakami, Nara; Masahiro Mori, Tsuzuki; Shigenori Itoyama, Nara, all of Japan

[73] Assignee: Canon Kabushiki Kaisha, Tokyo, Japan

[21] Appl. No.: 112,966

[22] Filed: Aug. 30, 1993

[30] Foreign Application Priority Data

Sep. 1, 1992 [JP] Japan .................................. 4-233775

[51] Int. Cl.$^6$ .......................................... H01L 31/048
[52] U.S. Cl. ...................... 136/251; 136/259; 257/433; 427/461; 437/2; 437/211; 437/219
[58] Field of Search ................................. 136/251, 259; 257/433–434; 437/2–5, 209, 211, 219; 427/213.32, 221, 461

[56] References Cited
U.S. PATENT DOCUMENTS

| | | | |
|---|---|---|---|
| 4,692,557 | 9/1987 | Samuelson et al. | 136/251 |
| 5,086,003 | 2/1992 | Hammerbacher | 437/2 |
| 5,264,285 | 11/1993 | Dougherty | 428/427 |
| 5,273,593 | 12/1993 | Marquardt et al. | 136/251 |

*Primary Examiner*—Aaron Weisstuch
*Attorney, Agent, or Firm*—Fitzpatrick, Cella, Harper & Scinto

[57] ABSTRACT

According to the invention, there is provided a solar cell module comprising a conductive substrate; a semiconductor layer having a photoelectric converting function formed on the substrate; a transparent conductive layer formed on the semiconductor layer; and an organic resin formed by electrostatic powder coating on the transparent conductive layer, whereby the surface covering material is improved in weather and heat resistance and is free from delamination in prolonged outdoor use. Also, the formation of a thick resin layer ensures scratch resistance and moisture resistance. The simple coating process facilitates automation of production.

9 Claims, 3 Drawing Sheets

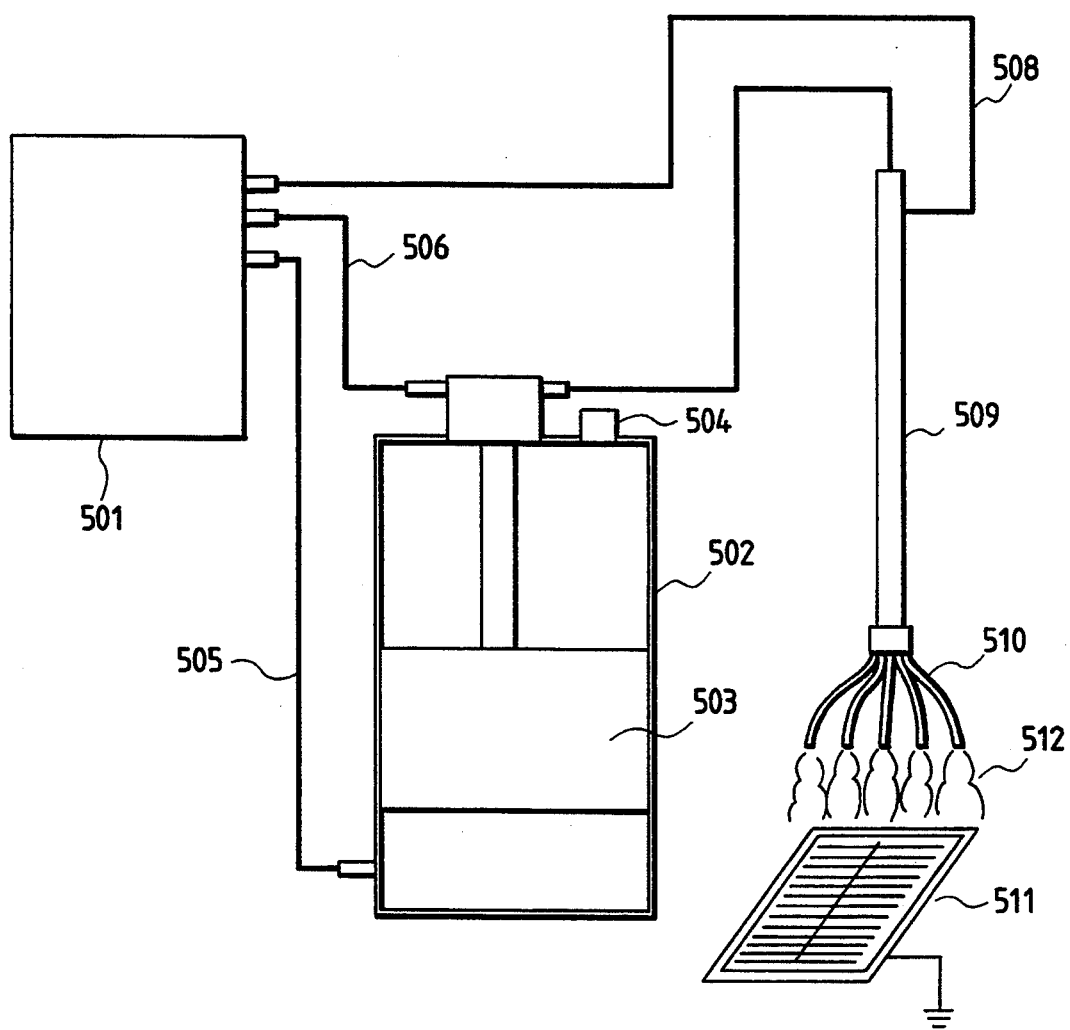

SOLAR CELL MODULE AND METHOD FOR PRODUCING THE SAME

BACKGROUND OF THE INVENTION

1. Field of the Invention

The present invention relates to a solar cell module, and more particularly to a solar cell module composed of a substrate covered with a photoelectric converting element having a semiconductor photoactive layer serving as a photoelectric converting member, and a method for covering the surface of the photoelectric converting element.

2. Related Background Art

Recently, concern over ecological problems has spread worldwide. Particularly, there is a deep concern for the warming phenomenon of the earth resulting from $CO_2$ discharge etc., and the desire for clean energy is increasing. Because of such trend, solar cells, which are photoelectric converting elements, are expected to be widely used as a clean energy source, in consideration of their safety and ease of handling.

Solar cells have been investigated in various forms, as exemplified by:

(1) crystalline silicon solar cells;
(2) polycrystalline silicon solar cells;
(3) amorphous silicon solar cells;
(4) copper indium selenide solar cells; and
(5) compound semiconductor solar cells.

Among these, active research and development efforts are being conducted on the thin film crystalline silicon solar cells, the compound semiconductor solar cells, and amorphous silicon solar cells, because these solar cells are of relatively low cost and can be produced in a large area.

Further, among these solar cells, the thin film solar cells, represented by amorphous silicon solar cells formed by depositing amorphous silicon on a conductive metal substrate and forming thereon a transparent conductive layer is anticipated as a widely used future solar cell, as it can provide the advantages of light weight, high impact strength, and flexibility.

In the above-explained configuration, however, in contrast to the case of silicon deposition on a glass superstrate, the light-receiving surface has to be covered with a transparent covering material in order to protect the semiconductor element from moisture or mechanical impact. Said surface covering material has been composed, at its exterior portion, of a transparent thin film of fluorinated polymer such as a fluorinated resin film or fluorinated resin paint, and, at its interior portion, of various transparent thermoplastic organic regions. This is because the fluorinated polymer, being weather resistant and water repellent, is capable of reducing the loss in the conversion efficiency of the solar cell module resulting from the loss in light transmittance caused by deterioration or discoloration, while the transparent thermoplastic resin, being inexpensive, can be employed in a large amount for protecting the photovoltaic element.

FIG. 4 shows an example of such a solar cell module, wherein there are shown a thin fluorinated polymer film 401, a transparent thermoplastic organic resin 402, a photovoltaic element 403, and an insulating layer 404. In the illustrated example, an organic polymer resin is used at the rear surface. More specifically, the thin film 401 is composed of a fluorinated resin film such as an ETFE (ethylene-tetrafluoroethylene copolymer) film or a PVF (polyvinyl fluoride) film, while the transparent thermoplastic organic resin 402 is composed of EVA (ethylene-vinyl acetate copolymer) or butyral resin, and the insulating layer 404 is composed of various organic resin films such as a nylon film or an aluminum-laminated Tedlar film. In this example, the transparent thermoplastic organic resin 402 functions as the adhesive for the photovoltaic element 403, the fluorinated resin film 401, and the insulating layer 404, and also serves as a filler for protecting the solar cell, which is the photovoltaic element, from scratching or impacts from the outside.

However, in the above-explained structure, after a prolonged outdoor exposure of as long as several tens of years, because of the inevitably limited weather resistance of the transparent organic resins, it may become turbid due to partial gelation of the resin or turn yellowish due to an increase in the conjugated double bonds, thus eventually resulting in a loss in the optical transmittance of the resin. For this reason such structure cannot be considered satisfactory for protecting the photovoltaic element, and a loss in the conversion efficiency of the solar cell module thus far has been unavoidable.

Besides, such organic resins, being generally thermoplastic, become softened and unable to exhibit the required performance for protecting the photovoltaic element, under conditions where the surface of the substrate of the solar cell module reaches a high temperature, for example under direct outdoor sunlight. Also the softening of the organic resin deteriorates the adhesive force thereof, thus eventually leading to so-called microdelamination in which the fluorinated polymer film positioned above is locally delaminated.

On the other hand, the outermost fluorinated polymer film tends to form pinholes during the forming process, thus inducing intrusion of rainwater or the like. Such defects give rise to deterioration and delamination of the covering material, and eventually lead to undesirable influence on the photovoltaic element itself. Also in the conventional covering structure, the organic resin layer is exposed at the end faces of the solar cell module, and moisture intrusion from such end faces of the resin layer may cause delamination of the covering material at the end portions under harsh conditions of outdoor use.

The photovoltaic element to be covered or the current-collecting electrode thereon is susceptible to the influence of moisture, and glass coating is best for preventing such influence. For this reason, glass sealing of the solar cell has been employed in many instances. However, such glass covering is deficient in flexibility, impact resistance, weight, and cost.

Furthermore, in the structure of the solar cell module shown in FIG. 4, the thin fluorinated polymer film is poor in moisture resistance, and, in combination with the moisture absorbability of the organic resin at the inside, the deterioration of the photovoltaic element by moisture has been considered unavoidable in prolonged outdoor use under a high temperature and a high humidity.

The covering of the solar cell module shown in FIG. 4 has been formed by so-called vacuum lamination in which the photovoltaic element superposed with the sheet-shaped covering materials is subjected to degassing under vacuum and heating and pressed with rubber sheets or the like, whereby the top and bottom films and the thermoplastic organic resin are adhered to the photovoltaic element. However, this method is basically a batch process, which is limited in productivity, because of the time-consuming heating process, difficulty in automation, etc.

Also, in order to avoid the above-mentioned drawbacks it has been proposed to coat the surface of the photovoltaic element with a weather-resistant solvent-based paint, but such method has been associated with various drawbacks such as difficulty in obtaining a thick film, eventual damage to the photovoltaic element, difficulty in the recovery of excess paint, undesirable work conditions, and air pollution resulting from evaporated solvent. Also, the evaporation of organic solvent during paint drying often forms small pores, through which water vapor may intrude to deteriorate the performance of the photovoltaic element.

SUMMARY OF THE INVENTION

In consideration of the foregoing, the object of the present invention is to provide a surface covering material for solar cell modules, exhibiting satisfactory weather resistance, heat resistance, adhesion to the photovoltaic element, and scratch resistance, and capable of minimizing the long-term deterioration of the performance of the photovoltaic element resulting from moisture permeation, and also a surface covering method for the solar cell module, which is simple to perform and enables easy automation.

As a result of intensive investigations, the present inventors have found that the above-mentioned object can be attained by a solar cell module comprising a conductive substrate, a semiconductive photoactive layer formed on said substrate and having a photovoltaic function, a transparent conductive layer formed on said semiconductor layer, and an organic resin layer formed on said transparent conductive layer by electrostatic powder coating, wherein said electrostatic powder coating consists of electrostatically charging powdered coating resin, forming by electrostatic attractive force a powdered coating layer on the material to be coated, and sintering said powdered coating layer to form a coated film.

The above-mentioned organic resin is composed of at least one of fluorinated resin, acrylic resin, epoxy resin, epoxy polyester resin, polyester resin, acrylsilicone resin, silicone resin, and modified silicone resin. Also, in the formation of said resin layer, particles of inorganic oxide can be dispersed therein by mixing the particles of such inorganic oxide in the powdered resin during the electrostatic powder coating.

BRIEF DESCRIPTION OF THE DRAWINGS

FIG. 5 is a schematic view showing the method of forming the solar cell module of the present invention by electrostatic powder painting.

DETAILED DESCRIPTION OF THE PREFERRED EMBODIMENTS

Figure 1:
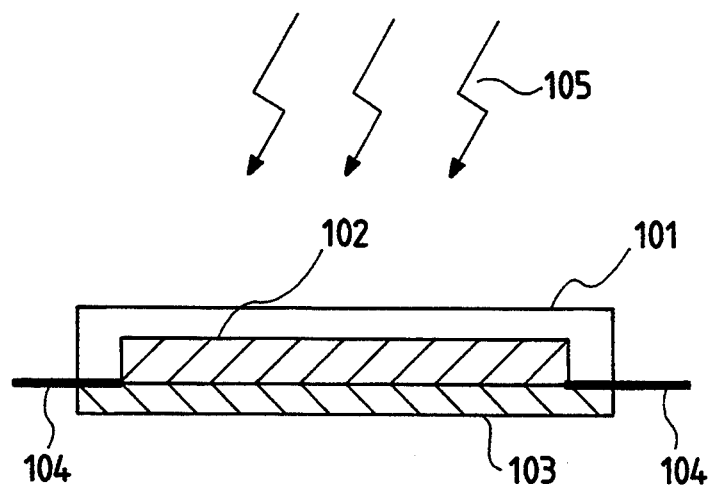
FIG. 1 is a schematic cross-sectional view of a solar cell module embodying the present invention.

According to the present invention, in a solar cell module including a photovoltaic element containing a semiconductor photoactive layer serving as a photoconverting member and a transparent conductive layer on a conductive substrate, at least the light-receiving surface of said module is covered with transparent organic resin by electrostatic powder coating to provide the following advantages:

(1) The covering is excellent in weather resistance and heat resistance;

(2) There can be obtained an extremely strong surface covering with prolonged reliability, as it is free from delamination within the covering material because of the absence of the conventional interface between the protective film and the transparent thermoplastic organic resin, and it also shows satisfactory adhesion to the photovoltaic element;

(3) The delamination of the covering material at the end faces can be prevented since the coated film can be formed on the end faces in the same manner as on the surface of the photovoltaic element;

(4) Since a hard and thick resin layer can be easily formed, there can be provided a covering of sufficient strength for protecting the photovoltaic element from external damaging factors, particularly scratches;

(5) Formation of a thick resin layer and elimination of the transparent thermoplastic organic resin allow reduction of the deterioration of photovoltaic elements by moisture, resulting from moisture permeation of the fluorinated polymer film and moisture absorption by the transparent thermoplastic organic resin;

(6) Since the process steps required for forming the covering are powder coating and powder sintering only, the coating time can be reduced in comparison with the conventional vacuum laminator method. Also, automated production can be easily achieved by the use of an automatic coating/sintering line with a belt conveyor;

(7) In contrast to the ordinary solvent-based coating, the electrostatic powder coating can reduce the pinhole generation, because of the absence of solvent evaporation. Also there can be obtained a resin layer with basically superior moisture resistance, and a film with a denser structure in the molecular sense can be formed. Besides, the easier recovery of excess coating material increases the efficiency of use of materials, and the absence of solvent avoids the concern for air pollution.

In addition, the following advantages can be attained by including particles of inorganic oxide during the formation of the transparent organic resin layer, by mixing and dispersing particles of said inorganic oxide in the powdered resin during the electrostatic powder coating:

(8) A reduced reflectance at the light-receiving surface, namely a reduced light loss in the surface covering material, due to the light confining effect in the resin, caused by light scattering of the inorganic oxide;

(9) Reduced deterioration of the resin by ultraviolet light, resulting from ultraviolet absorption ny the inorganic oxide;

(10) Reduced deterioration of the photovoltaic element by ultraviolet light, resulting from a reduced amount of ultraviolet light reaching said element, because of the ultraviolet absorption by the inorganic oxide;

(11) An improved scratch resistance due to an increased hardness of the resin surface;

(12) A reduced covering material cost per unit area, achieved by the mixing of inexpensively available inorganic oxide, in comparison with the case of covering with resin alone, and leading to the cost reduction of the solar cell module.

FIG. 1 is a schematic view of the solar cell module of the present invention, wherein there are shown transparent organic resin 101 formed by electrostatic powder coating; a photovoltaic element 102; and insulating layer 103; and output terminals 104 for obtaining the electromotive force. The light 105 from the outside enters from the side of the transparent organic resin 101 and reaches the photovoltaic element 102, and the resulting electromotive force is outputted from the output terminals 104.

The solar cell module of the present invention can be prepared, for example, by adhering the photovoltaic element on a rear reinforcing plate with insulating adhesive, and forming thereon the transparent organic resin layer by electrostatic powder coating.

Said transparent organic resin layer 101 is formed by electrostatic powder coating. The apparatus for electrostatic powder coating can be generally classified into the corona charging type and the tribo charging type. The corona charging type is superior in providing a larger amount of charging and lack of selectivity in the resin to be coated. Also, the tribo charging type is superior in a higher coating efficiency and smooth finish even if a thick coating is formed in one painting.

The average particle size of the powdered resin is preferably as small as possible, because the coated surface becomes smoother and the film thickness distribution becomes smaller with smaller particle size. More specifically there is desired a particle size range of 1 to 100 $\mu$m, preferably 10 to 50 $\mu$m.

Examples of the transparent organic resin include fluorinated resin, acrylic resin, epoxy resin, epoxypolyester resin, polyester resin acrylsilicone resin, modified silicon resin, and polyimide resin. Such resin contains in advance a setting agent, a crosslinking agent, or a reaction catalyst such as isocyanate, organic peroxide, azo compound, amine, amide, a benzoin derivative, acid anhydride, or an acid or alkali catalyst and can form a strong organic resin layer by a setting reaction such as a crosslinking reaction, a dehydrating polymerization, or a radical polymerization after thermal fusion. Said setting reaction is generally promoted by heat, but it may also be promoted by irradiation of an energy beam such as ultraviolet light, radiation, electron beam, or ion beam. Unless the resin itself has weather resistance, as in the case of fluorinated or silicon resins, an ultraviolet absorbing agent and an antioxidant are preferably added to the resin. The transparent organic resin may be composed of a single resin, or a mixture of different resins, or a laminated structure of different resins. In order to suppress the deterioration in performance of the photovoltaic element by moisture, the water vapor permeation rate of the entire transparent organic resin layer under conditions of 40° C. and 90% RH is preferably not more than $2 \times 10$ g/m$^2$.24 hr, more preferably not more than 1 g/m$^2$.24 hr.

Also, in order to minimize the loss in the light amount reaching the solar cell, the light transmittance of the transparent organic resin 101 is preferably at least 80% in the visible wavelength region from 400 to 800 nm. Furthermore, in order to facilitate the entry of light from the atmosphere, the refractive index is preferably within a range of 1.1 to 2.0, more preferably from 1.1 to 1.6.

In the transparent organic resin 101, there may be mixed small particles of an inorganic oxide, in order to effectively utilize the light by scattering within the resin and reduce reflection, also to increase the surface hardness of the resin and to reduce the ultraviolet transmission. The average particle size of such inorganic oxide particles is preferably within a range from 0.01 to 10 $\mu$m, more preferably from 0.01 to 1 $\mu$m, because a smaller particle size can increase the scattering of light while decreasing the transmission loss of the light. The mixing reaction of said inorganic oxide particles to the transparent organic resin is so determined so as to minimize the light transmission loss by the internal confining effect of the light, and is desirably within a range of 5 to 30 parts by weight. Examples of the inorganic oxide particles include $SiO_2$, $Al_2O_3$, MgO, $ZnO_2$, and $TiO_2$. Also, for absorbing the ultraviolet light, various ultraviolet-absorbing organic compounds may be added to the transparent organic resin, in addition to said inorganic oxide. Furthermore, in order to improve the adhesion between the transparent conductive layer at the surface of the photovoltaic element and the organic resin, a small amount of a silane coupling agent or an organometallic compound such as an organic titanate may be added in advance to the transparent organic resin. Otherwise, such compound may be coated in advance on the surface of the transparent conductive layer.

The transparent organic resin layer 101 is formed by uniformly depositing the powdered transparent organic resin on the entire light-receiving surface of the photovoltaic element with the aforementioned electrostatic powder coating apparatus of the corona charging type or the tribo charging type, followed by fusion and setting of said powdered resin. In the case of the apparatus of the corona charging type, an optimum applied voltage is selected within a range of −10 to −100 kV or 10 to 100 kV, according to the properties of the coating material. The setting of the resin can be achieved by heat or by an energy beam, as explained above. In the case of forming a thick organic resin layer or superposing different resin layers, the above-explained process may be repeated to obtain a desired transparent organic resin layer. The thickness of the transparent organic resin layer is preferably within a range of 5 to 1000 $\mu$m, more preferably 10 to 500 $\mu$m. The transparent organic resin layer may be formed prior to or after the formation of the insulating layer.

The insulating layer 103 is required in order to maintain electric insulation between the conductive substrate and the exterior. It is preferably composed of an insulating material which can provide sufficient adhesion to the conductive substrate, excellent long-term durability and flexibility capable of withstanding thermal expansion and contraction. Various known organic resins can be used for this purpose. In the case where the electrostatic powder coating is conducted after the formation of the insulating layer, it is required to have sufficient heat resistance for withstanding the sintering conditions of the powdered paint. Said insulating layer can be formed, for example, by thermal fusion of a thermoplastic organic resin sheet, extrusion coating of a thermoplastic organic resin, coating of reaction-settable adhesive material, coating of solvent-based organic resin paint, or electrostatic powder coating of powdered organic resin. Also, a resin film may be applied on this formed resin layer, in order to provide sufficient insulation.

On the outside of said insulating layer 103, there may be additionally applied a reinforcing plate, in order to increase the mechanical strength of the solar cell module, or to avoid thermal strain in the photovoltaic element in case the powdered paint is sintered at a high temperature. For example, a steel plate, a plastic plate, or an FRP (fiber-reinforced plastics) plate can be used for this purpose. The reinforcing plate can be adhered to the insulating layer with a reaction-settable adhesive such as epoxy resin, acrylic resin or silicone resin, a hot-melt adhesive such as EVA (ethylene-vinyl acetate copolymer) or polyvinyl butyral, or a two-sided adhesive tape.

Figure 2:
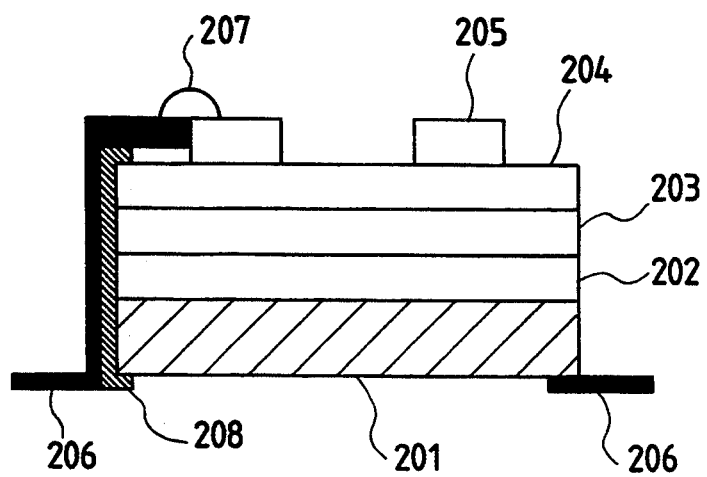
FIG. 2 is a schematic cross-sectional view of the basic configuration of a photovoltaic element to be employed in the solar cell module shown in FIG. 1.

The photovoltaic element employed in the present invention is provided at least with a semiconductor photoactive layer as the light converting member, and an example of the structure of said element is illustrated schematically in FIG. 2, wherein there are shown a conductive substrate 201; a rear reflecting layer 202; a semiconductor photoactive layer 203; a transparent conductive layer 204; and a current-collecting electrode 205.

The conductive substrate 201 serves as the substrate for the photovoltaic element and also as a lower electrode. It can be composed, for example, of silicon, tantalum, molybdenum, tungsten, stainless steel, aluminum, copper, titanium, carbon sheet, lead-plated steel plate, or a resinous film or a ceramic material bearing a conductive layer thereon. On said conductive substrate 201 there may be formed, as the rear reflecting layer 202, a metal layer and/or a metal oxide layer. Said metal layer can be composed, for example, of Ti, Cr, Mo, W, Al, Ag or Ni, and said metal oxide layer can be composed, for example, of ZnO, $TiO_2$, $SnO_2$, or $In_2O_3-SnO_2$ (ITO). Said metal layer or metal oxide layer can be formed, for example, by resistance-heated evaporation, electron beam evaporation, or sputtering.

The semiconductor photoactive layer 203 effects the photoelectric conversion, and can be composed, for example, of pn-junction polycrystalline silicon, pin-junction amorphous silicon, or a compound semiconductor such as $CuInSe_2$, $CuInS_2$, GaAs, or a heterojunction such as $CdS/Cu_2S$, $CdS/Cu_2S$, CdS/CdTe, CdS/InP, or $CdTe/Cu_2Te$. Said semiconductor photoactive layer can be formed, in the case of polycrystalline silicon, by sheet formation of fused silicon or heat treatment of amorphous silicon, or, in the case of amorphous silicon, by plasma CVD employing silane gas etc., and, in the case of the compound semiconductors, by ion plating, ion beam deposition, vacuum evaporation, sputtering, or electrodeposition.

The transparent conductive layer 204 serves as the upper electrode of the solar cell. It is composed, for example, of $In_2O_3$, $SnO_2$, $In_2O_3-SnO_2$ (ITO), ZnO, $TiO_2$, $Cd_2SnO_4$, or a crystalline semiconductor layer with a high impurity concentration, and can be formed, for example, by resistance-heated evaporation, sputtering, spraying, CVD, or impurity diffusion.

For efficient current collection, a grid-shaped current-collecting electrode 205 may be provided on the transparent conductive layer. Such current-collecting electrode 205 may be formed, for example, by Ti, Cr, Mo, W, Al, Ag, Ni, Cu, Sn, or a conductive paste such as silver paste. Said electrode 205 can be formed, for example, by sputtering, resistance-heated evaporation or CVD employing a mask pattern, overall metal film evaporation followed by patterning with etching of unnecessary portions, direct formation of the grid electrode pattern by optical CVD, formation of a negative mask pattern of the grid electrode followed by plating or conductive paste printing. The conductive paste is generally composed of finely powdered silver, gold, copper, nickel, or carbon dispersed in a polymer binder, which can be, for example, polyester, epoxy, acrylic, alkyd, polyvinyl acetate, rubber, urethane, or phenolic resin.

Finally, output terminals 206 for outputting the electromotive force are mounted on the conductive substrate and the current-collecting electrode. On the conductive substrate, a metallic member such as a copper tab is mounted by spot welding or soldering, and, on the current-collecting electrode, a metallic member is electrically connected by conductive paste or by solder.

The photovoltaic elements prepared as explained above are connected in serial or parallel manner, according to the desired voltage or current. Also, the photovoltaic elements may be integrated on an insulated substrate to obtain the desired voltage or current.

In the following the present invention will be clarified further by specific examples thereof.

EXAMPLE 1

First there will be explained the preparation of an amorphous silicon (a-Si) solar cell (photovoltaic element) by a process explained with reference to FIG. 2.

On a clean stainless steel substrate 201, an Al layer (5000Å thick) and a ZnO layer (5000Å thick) were formed in succession by sputtering, as the rear reflecting layer 202. Then there were formed, by plasma CVD, an a-Si layer with n-type conductivity from a gaseous mixture of $SiH_4$, $PH_3$, and $H_2$, an a-Si layer with i-type conductivity from a gaseous mixture of $SiH_4$ and $H_2$, and a microcrystalline $\mu c$-Si layer of p-type conductivity from a gaseous mixture of $SiH_4$, $BF_3$, and $H_2$ to obtain a tandem type a-Si based photoelectric converting semiconductor layer 203 with a configuration of n-type layer (150Å thick)/i-type layer (4000Å thick)/p-type layer (100Å thick)/n-type layer (100Å thick)/i-type layer (800Å thick)/p-type layer (100Å thick). Then an $In_2O_3$ film (700Å thick) was formed as the transparent conductive layer 204, by resistance-heated evaporation of In in an $O_2$ atmosphere. Then the current-collecting grid electrode 205 was formed by screen printing of silver paste. Finally, a copper tab constituting the negative-side output terminal 206 was mounted on the stainless steel substrate with stainless steel solder, and a tin tape constituting the positive-side output terminal was mounted on the current-collecting electrode with conductive adhesive 207 while the electrical insulation was provided by an insulating member 208. The photovoltaic element was completed in this manner.

Figure 3:
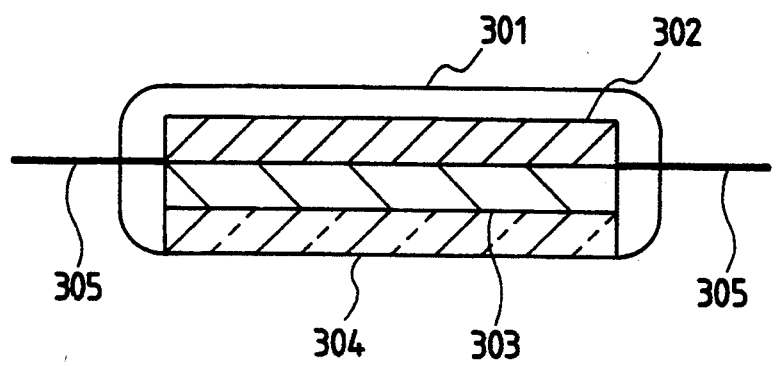
FIG. 3 is a schematic cross-sectional view of a solar cell module of the present invention.
Figure 4:
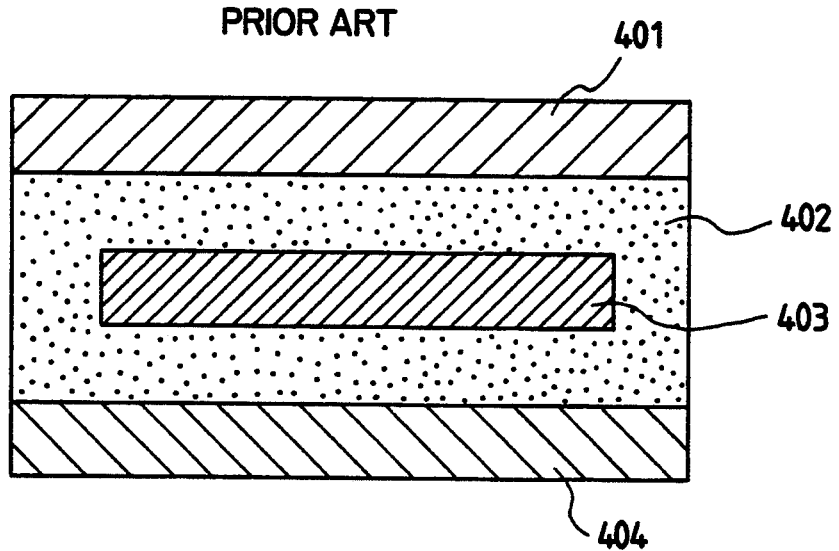
FIG. 4 is a schematic cross-sectional view of a conventional solar cell module for comparison.

Now the process of obtaining a solar cell module by providing said photovoltaic element with a covering will be explained with reference to FIG. 3.

On the rear face of the prepared photovoltaic element 302, there was coated a one-liquid epoxy adhesive 303 (Hamatite Y3800 manufactured by Yokohama Rubber Co.), and a galvanized steel plate 304 (0.3 mm thick) was adhered thereto as the reinforcing plate. Then the output terminals 305 were masked with tapes, and the light-receiving surface of the photovoltaic element was uniformly coated with powdered fluorinated resin coating material (average particle size 30 $\mu$m) by means of an electrostatic powder coating apparatus of tribo charging type (manufactured by Nordson Corp.).

Said electrostatic powder coating apparatus is shown in FIG. 5, wherein powdered coating material 503, contained in a paint tank 502 provided with an exhaust outlet 504 and connected to a powder agitating air pipe 505 connected to pressurized air supply means 501, is mixed with powder feeding air 506, and is supplied, together with mixing ratio adjusting air 508, to a tribocharging gun 509. The powder 512 is emitted from a nozzle 510 which is divided into ten or more linearly arranged branches, and is uniformly deposited over the entire surface of the grounded large-area photovoltaic element 511 by electrostatic attractive force.

Subsequently, heating was conducted in an oven for 30 minutes at 170° C. to fuse and set the coating material. This powder coating process was executed twice to obtain a fluorinated resin layer 301 of a thickness of about 300 $\mu$m. Finally the masks on the output terminals were removed to complete the solar cell module.

The solar cell module prepared as explained above was evaluated for the following items:

(1) Weather resistance:

The solar cell module was placed in a sunshine weather meter and subjected to an accelerated weathering test by cycles of light irradiation and rain. The changes in appearance and in the performance of the solar cell were evaluated after 5,000 hours:

(2) Heat resistance:

The solar cell module was let to stand in an atmosphere of 100° C. for 24 hours, and the change in appearance was observed;

(3) Temperature cycle:

The solar cell module was subjected to 50 temperature cycles of −40° C./1 hour and 90° C./1 hour each, and the change in appearance of the module after testing was observed;

(4) Temperature-humidity cycle:

The solar cell module was subjected to 20 temperature-humidity cycles of −40° C./1 hour and 85° C./85% RH/4 hours each, and the change in appearance of the module after testing was observed;

(5) Moisture resistance:

The solar cell module was placed in an atmosphere of 85° C./85% RH, and the light-receiving surface was irradiated with artificial solar light by means of a solar simulator. The performance of the module after 24 hours was evaluated by the relative loss rate of the conversion efficiency;

(6) Scratch resistance:

The scratch resistance of the light-receiving surface of the solar cell module was evaluated by the pencil hardness method;

(7) Effective conversion efficiency of the solar cell module.

EXAMPLE 2

A solar cell module was prepared in the same manner as in Example 1, except that the transparent organic resin layer was formed by adding powdered titanium oxide of an average particle size of 0.5 $\mu$m in an amount of 10 parts by weight, to the powdered fluorinated resin coating material, as an inorganic oxide for absorbing the ultraviolet light.

EXAMPLE 3

Two powder painting steps as in Example 1 were performed, the first one conducted with powdered acrylic resin paint (average particle size 30 $\mu$m) with an ultraviolet absorbing agent and an antioxidant added and a second step conducted with powdered fluorinated resin to form transparent organic resin layers with a lower acrylic resin layer and an upper fluorinated resin layer, in order to improve the adhesion of the fluorinated resin to the transparent conductive layer. The other processes of Example 1 were repeated, thereby obtaining a solar cell module.

EXAMPLE 4

A photovoltaic element was prepared in the same manner as explained above. After the output terminals were masked, the surface of the transparent conductive layer was treated by immersing the photovoltaic element in 0.5% solution of a silane coupling agent (Silaace, manufactured by Chisso Co.) in water-alcohol, followed by air drying and drying at 120° C. for 5 minutes. Then, electrostatic powder coating was conducted with powdered acrylic resin paint on the rear surface and with powdered fluorinated resin paint on the light-receiving surface, thereby forming an insulating acrylic resin layer of a thickness of ca. 300 $\mu$m on the rear surface and a transparent fluorinated resin layer thickness of ca. 300 $\mu$m on the light-receiving surface. Subsequently, the photovoltaic element was adhered on a glass-fiber reinformed plastic plate of a thickness of 0.5 mm by an adhesive as in Example 1 to obtain a solar cell module.

REFERENCE EXAMPLE 1

On a photovoltaic element prepared in the same manner as in Example 1, there were superposed an EVA sheet (460 $\mu$m thick) and an ETFE film (Tefzel, manufactured by dupont; 38 $\mu$m thick) on the light-receiving surface, and an EVA sheet (460 $\mu$m), a nylon film (70 $\mu$m), an EVA sheet (460 $\mu$m) and a galvanized steel plate (0.3 mm) on the rear surface, and these components were laminated in a vacuum laminator to obtain a solar cell module.

REFERENCE EXAMPLE 2

A solar cell module was prepared in the same manner as in Example 1, except that a transparent organic resin layer of a thickness of 70 $\mu$m was prepared by coating solvent-based fluorinated resin paint (Lumifron manufactured by Asahi Glass Co.), instead of powdered fluorinated resin paint.

The results of evaluation of the solar cell modules of Examples 1 to 4 and Reference Examples 1 and 2 are summarized in Table 1.

As is apparent from Table 1, the solar cell modules covered with the powdered organic resin paint were generally superior in weather resistance and heat resistance to those of the reference examples, although the weather resistance in the case of powdered acrylic resin was somewhat inferior. Also, these solar cell modules did not show any change in appearance in the temperature cycle test and in the temperature-humidity cycle test, simulating the harsh conditions in outdoor use. The hard, thick resin layer prevents damage to the element, and reduces the deterioration of the performance of the solar cell module by humidity. Also, in the manufacturing process, the covering resin can be formed faster and the automation thereof will be much easier, in comparison with the conventional pressing together of the covering materials with the vacuum laminator.

Furthermore, in Example 2, the formation of the transparent organic resin layer at the surface of the photovoltaic element by the powdered resin containing inorganic oxide particles provided a less damage susceptible solar cell module with an increased surface hardness, and improved the conversion efficiency of the solar cell module, because of a reduced light loss in the transparent organic resin layer by the light confining effect achieved by light scattering by said particles.

Also, Example 4 indicates that the adhesion between the powdered resin layer and the photovoltaic element was improved by surface treatment with the silane coupling agent.

The surface covering method of the solar cell module according to the present invention is not limited to the foregoing examples, but is subject to various modifications within the scope and spirit of the appended claims.

According to the present invention, the solar cell module is covered, at least on the light-receiving surface thereof, with a transparent organic resin layer formed by electrostatic powder painting, whereby the transparent thermoplastic organic resin or fluorinated polymer film, which have been conventionally employed, can be dispensed with. As a result, there can be provided a solar cell module with excellent weather and heat resistance, and free from delamination of the covering materials. Also, the formation of a thick resin film can satisfactorily prevent the surface damage from reaching the photovoltaic element, and also can suppress the deterioration in performance of the photovoltaic element resulting from moisture permeation, owing to the barrier to moisture property of the resin. On the other hand, the powder painting, which is simpler to perform, can easily realize automation of the production of the solar cell modules. Furthermore, since said painting does not involve solvent, the formed film is free from pinholes resulting from solvent evaporation, and there are no detrimental effects on the health of the production operator and no air pollution.

Furthermore, the surface covering formation by electrostatic powder painting facilitates uniform dispersion of inorganic oxide particles into the transparent resin on the light-receiving surface. Such particle dispersion in the resin can minimize the light loss in the surface covering material, and can also intercept the ultraviolet light detrimental to the photovoltaic element and the resin and can improve the surface hardness.

What is claimed is:

1. A solar cell module comprising:
   a conductive substrate;
   a semiconductor layer having a photoelectric converting function formed on said substrate;
   a transparent conductive layer formed on said semiconductor layer; and
   an organic resin layer formed by electrostatic powder coating on said transparent conductive layer.

2. A solar cell module according to claim 1, wherein said organic resin is composed of at least one of fluorinated resin, acrylic resin, epoxy resin, epoxy-polyester resin, polyester resin, acrylsilicone resin, silicone resin, and modified silicone resin.

3. A solar cell module according to claim 1, wherein particles of an inorganic oxide are dispersed in the transparent resin, by effecting the electrostatic powder coating with the particles of the inorganic oxide mixed in the powder of said resin.

4. A solar cell module according to claim 1, wherein a reinforcing plate is adhered to an insulating layer formed on the rear surface of said photovoltaic element.

5. A solar cell module according to claim 1, wherein a coupling agent composed of an organometallic compound is added to said resin, or the surface of said transparent conductive layer is treated with a coupling agent composed of an organometallic compound.

6. A method for forming a solar cell module, comprising steps of:
   applying a voltage to a photoelectric converting element;
   electrically charging powdered resin coating material;
   depositing said charged powder on the photoelectric converting element by electrostatic force; and
   hardening the powder deposited on said photoelectric converting element.

7. A method according to claim 6, wherein said charging of said powder is achieved by corona charging.

8. A method according to claim 7, wherein said deposition of said charged powder on the photoelectric converting element is achieved by coating with linearly arranged plural nozzles.

9. A method according to claim 6, wherein said charging of said powder is achieved by tribo charging.

* * * * *

TABLE 1

Evaluation of solar cell modules of the examples and reference examples

| | Weather Resistance | Heat Resistance | Temperature Cycle | Temperature Humidity Cycle | Moisture* Resistance | Scratch Resistance | Conversion Efficiency |
|---|---|---|---|---|---|---|---|
| Example 1 | ⊙ | ⊙ | ○ | ⊙ | 15% | ○ | 7.0% |
| Example 2 | ⊙ | ⊙ | ○ | ⊙ | 12% | ○ | 7.2% |
| Example 3 | slightly yellow | ⊙ | ⊙ | ⊙ | 6% | ○ | 6.8% |
| Example 4 | ⊙ | ⊙ | ⊙ | ⊙ | 14% | ○ | 6.9% |
| Reference Example 1 | yellow, turbid | wrinkles | locally delaminated | delaminated in ends | 25% | Δ | 7.2% |
| Reference Example 2 | slightly white turbid | ⊙ | ⊙ | ⊙ | 20% | X | 6.9% |

*relative loss rate in conversion efficiency
⊙ = EXCELLENT; ○ = BETTER; Δ = GOOD; X = POOR

UNITED STATES PATENT AND TRADEMARK OFFICE
CERTIFICATE OF CORRECTION

PATENT NO. : 5,389,159
DATED : February 14, 1995
INVENTOR(S) : ICHIRO KATAOKA, ET AL.

Page 1 of 2

It is certified that error appears in the above-indentified patent and that said Letters Patent is hereby corrected as shown below:

COLUMN 1

Line 44, "su-" should read --substrate,--; and

Line 45, "perstrate," should be deleted.

COLUMN 4

Line 62, "ny" should read --by--.

COLUMN 5

Line 26, "tribo charging" should read --tribocharging--;

Line 29, "tribo charging" should read --tribocharging--; and

Line 40, "resin acrylsilicone" should read --resin, acrylsilicone--.

COLUMN 6

Line 36, "tribo charging" should read --tribocharging--.

COLUMN 9

Line 1, "tribo" should read --tribo- --; and

Line 28, "hours:" should read --hours;--.

COLUMN 10

Line 35, "dupont;" should read --duPont;--.

UNITED STATES PATENT AND TRADEMARK OFFICE
CERTIFICATE OF CORRECTION

PATENT NO. : 5,389,159
DATED : February 14, 1995
INVENTOR(S) : ICHIRO KATAOKA, ET AL.

It is certified that error appears in the above-indentified patent and that said Letters Patent is hereby corrected as shown below:

COLUMN 11

Table 1, column "Scratch Resistance", Example 1, "o" should read --₀--; and Example 2 should read --⊙--.

COLUMN 12

Line 29, "steps" should read --the steps--; and

Line 46, "tribo charging." should read --tribocharging.--.

Signed and Sealed this

Twenty-third Day of May, 1995

BRUCE LEHMAN

Attesting Officer    Commissioner of Patents and Trademarks